United States Patent
Ashkeboussi et al.

(10) Patent No.: US 6,226,114 B1
(45) Date of Patent: May 1, 2001

(54) TEMPERATURE COMPENSATION FOR UNCOOLED LASER

(75) Inventors: Moshen Ashkeboussi, Alpharetta; Ryszard S. Ozarowski, Marietta, both of GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 0 days.

(21) Appl. No.: 09/109,606

(22) Filed: Jul. 2, 1998

(51) Int. Cl.[7] .............................. H04B 10/04; H01S 3/13; H01S 3/00
(52) U.S. Cl. .......................... 359/187; 359/180; 372/31; 372/33
(58) Field of Search .................................. 359/187, 180; 372/34, 35, 36, 31, 33; 330/256

(56) References Cited

U.S. PATENT DOCUMENTS

| | | | |
|---|---|---|---|
| 5,019,769 | * 5/1991 | Levinson | 372/31 |
| 5,267,071 | * 11/1993 | Little et al. | 359/154 |
| 5,361,156 | * 11/1994 | Pidgeon | 359/161 |
| 5,467,212 | * 11/1995 | Huber | 359/168 |
| 5,548,603 | * 8/1996 | Calvani et al. | 372/25 |
| 5,760,939 | 6/1998 | Nagarajan et al. | 359/161 |
| 5,761,230 | 6/1998 | OOno et al. | 372/38 |
| 5,809,049 | * 9/1998 | Schaefer et al. | 372/38 |
| 5,966,394 | * 10/1999 | Spurr et al. | 372/34 |

* cited by examiner

Primary Examiner—Jason Chan
Assistant Examiner—Christina Y Leung
(74) Attorney, Agent, or Firm—Hubert J. Barnhardt, III; Kenneth M. Massaroni; Kelly A. Gardner

(57) ABSTRACT

An optical transmitter (200) in a cable television system (100) includes an uncooled laser diode (250) and a thermal compensation circuit (FIG. 2). The thermal compensation circuit includes a voltage controlled attenuator (220) located between the transmitter input (205), at which an electrical information signal is received, and the laser diode (250). The thermal compensation circuit also includes a thermistor (230) that is situated physically near the laser diode (250) and that is characterized by a resistance that varies with temperature. The thermistor (230) is coupled to a controller (225) for sensing thermistor resistance changes, which are indicative of changes in the laser diode temperature, and for selectively controlling the attenuator (220) to attenuate the level of the electrical information signal.

18 Claims, 3 Drawing Sheets

TEMPERATURE COMPENSATION FOR UNCOOLED LASER

FIELD OF THE INVENTION

This invention relates generally to fiber optic communications, and more specifically to optical transmitters for use in fiber optic communications.

BACKGROUND OF THE INVENTION

Cable television systems typically include a headend section for receiving satellite signals and demodulating the signals to baseband. The baseband signal is then converted to an optical signal for transmission from the headend section over fiber optic cable. Optical transmitters are distributed throughout the cable system for splitting and transmitting optical signals, and optical receivers are provided for receiving the optical signals and converting them to radio frequency (RF) signals that are further transmitted along branches of the system over coaxial cable rather than fiber optic cable. Taps are situated along the coaxial cable to tap off the cable signals to subscribers of the system.

Various factors influence the ability to accurately transmit and receive optical signals within a cable television system. For example, temperature fluctuations in the laser environment and the laser itself, which cause variations in the optical modulation index of the optical transmitter, can result in variations in the output power of the laser in the optical transmitter and corresponding variations in the radio frequency (RF) output level of the optical receiver. These temperature variations, which can result in incorrect decoding and processing of the optical signal, can be significant in uncooled lasers, since the heat generated by the laser diode itself contributes to environmental temperature fluctuations.

Thus, what is needed is a better way to provide temperature-independent transmission of optical signals within a cable television system.

DETAILED DESCRIPTION OF A PREFERRED EMBODIMENT

Figure 1:
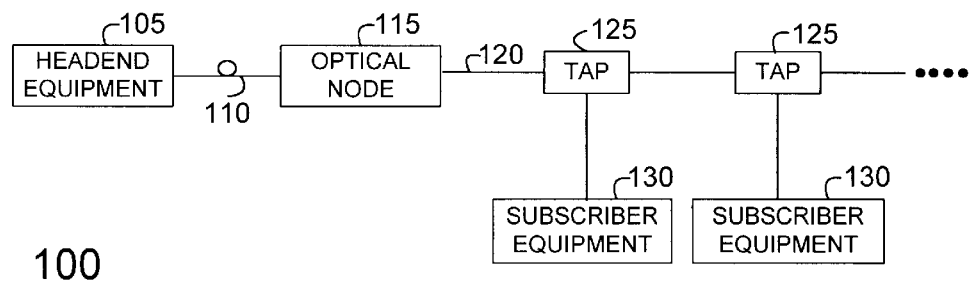
FIG. 1 is a block diagram of a cable television system in accordance with the present invention.

FIG. 1 shows a communications system, such as a cable television system 100 having both forward and reverse paths, i.e., having the ability to communicate downstream in the forward direction and upstream in the reverse direction. The cable television system 100 includes a headend 105 for receiving satellite signals that are demodulated to baseband or an intermediate frequency (IF). The baseband signal is then converted to cable television signals that are routed throughout the system 100 to subscriber equipment 130, such as set top decoders, televisions, or computers, located in the residences or offices of system subscribers. The headend 105 can, for instance, convert the baseband signal to an optical signal that is transmitted over fiber optic cable 110, in which case a remotely located optical node 115 converts the optical signal to an electrical radio frequency (RF) signal for further transmission through the system 100 over coaxial cable 120. Taps 125 located along the cable 120 at various points in the distribution system split off portions of the RF signal for routing to subscriber equipment 130 coupled to subscriber drops provided at the taps 125.

The system 100, as mentioned, also has reverse transmission capability so that signals, such as data, video, or voice signals, generated by the subscriber equipment 130 can be provided back to the headend 105 for processing. The reverse signals travel through the taps 125 and any nodes 115 and other cable television equipment, e.g., reverse amplifiers, to the headend 105. In the configuration shown in FIG. 1, RF signals generated by the subscriber equipment 130 travel to the node 115, which converts the RF signals to optical signals for transmission over the fiber optic cable 110 to the headend 105.

Figure 2:
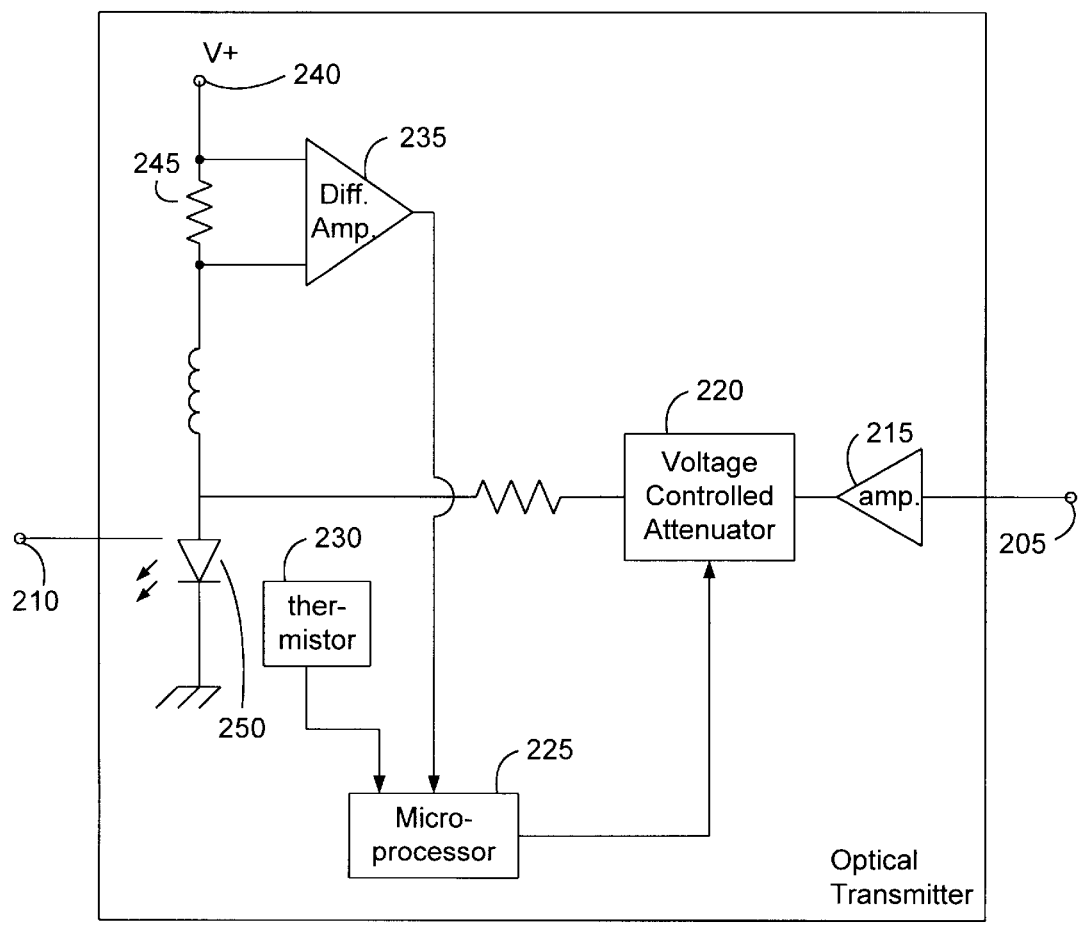
FIG. 2 is an electrical block diagram of an optical transmitter included in the cable television system of FIG. 1 in accordance with the present invention.

Referring to FIG. 2, an optical transmitter 200, which could transmit in the reverse direction, is provided for transmitting optical signals within the communication system 100. The transmitter 200 can, for instance, be included within the optical node 115, although other locations within a cable television system 100 may also include the reverse transmitter 200 of the present invention. The transmitter 200 receives, at an input 205, an analog information signal that is representative of one or more reverse RF signals from the subscriber equipment 130. At its output 210, the optical transmitter 200 provides an optical signal that is generated in accordance with the analog information signal.

More specifically, the optical transmitter 200 includes an amplifier 215 coupled to the input 205 for amplifying a received electrical information signal, which is then processed by an attenuator 220, such as a conventional voltage controlled attenuator. The attenuator 220 selectively attenuates the level of the electrical information signal under control of a microprocessor controller 225. The electrical information signal is received by a laser diode 250, such as an uncooled distributed feedback (DFB) laser diode. The laser diode 250 further receives a bias current that biases the laser diode 250 in a known manner. At the output 210, an optical information signal representative of the electrical information signal is emitted by the laser diode 250.

It will be appreciated by one of ordinary skill in the art that laser slope efficiency and threshold current vary as a function of laser temperature. In particular, the laser threshold current increases and the slope efficiency decreases at temperatures above 25 degrees C, and the opposite occurs when the laser temperature falls below 25 degrees C. These variations directly affect the levels of RF carriers measured at the output of a fiber optic link.

As laser temperature changes, known automatic power control (APC) circuits can be used to maintain the output power level of the laser to the initial set value as measured at 25 degrees C. Because the temperature changes result in changes in slope efficiency, however, this can only be done by varying the bias current provided to the laser, which necessarily changes the modulation index, when the RF input is kept constant, of the laser to once again affect the output level of the laser. As a result, laser modulation gain can become inconsistent enough to affect recovery of information at the optical receiver (not shown).

The optical transmitter 200 according to the present invention solves this problem by advantageously leveling the laser modulation gain across temperature. Specifically, this is accomplished by monitoring both bias current and temperature and by adjusting the electrical signal levels to provide thermal compensation, which is especially useful for less expensive uncooled laser diodes.

The thermal compensation circuit of the optical transmitter 200 comprises a thermistor 230 that is physically located very near the laser diode 250. The thermistor 230 is characterized by a resistance that varies with temperature in a known manner. The thermistor 230 is coupled to the microprocessor 225, which measures the resistance of the thermistor 230 and compares the measured resistance with a known resistance table to determine the approximate temperature of the laser diode 250. The microprocessor 225 can then locate the temperature value in a stored database to calculate the laser threshold current for that temperature, since laser threshold current varies in a known manner with temperature.

The optical transmitter 200 further includes means for measuring the bias current, which, as mentioned, can be varied by a conventional APC circuit (not shown). This can be done, for instance, by using a differential amplifier 235 to measure the voltage across a resistor 245 of the biasing circuitry. The output of the differential amplifier 235 is coupled to the microprocessor 225, which determines the bias current from the received voltage value in a conventional way. The microprocessor 225 can reference stored information to determine laser current above threshold that corresponds to the measured bias current and the calculated threshold current at any temperature, since the ratio of the bias current at 25 degrees C to the bias current at any temperature T (or, the ratio of the threshold current at 25 degrees C to the threshold current at any temperature T) is directly related to the change in the RF output level of the laser over temperature. Then, the level of the voltage controlled attenuator 220 can be adjusted by the microprocessor 225 to maintain the constant modulation index of the laser 250.

It will be appreciated that a database of relevant values and corresponding modulation index values and output power values could be programmed into a memory of the microprocessor 225 prior to operation of the optical transmitter 200. Alternatively, known equations describing the relationships between thermistor resistance, temperature, bias current, RF current, output power, and modulation index could be used by the microprocessor 225 to calculate the necessary attenuation. Although not shown in FIG. 2, it will further be appreciated that, if the peak RF signal level is not known, the RF signal may also need to be coupled in a conventional manner to the microprocessor 225 for determination of RF signal levels.

Figure 3:
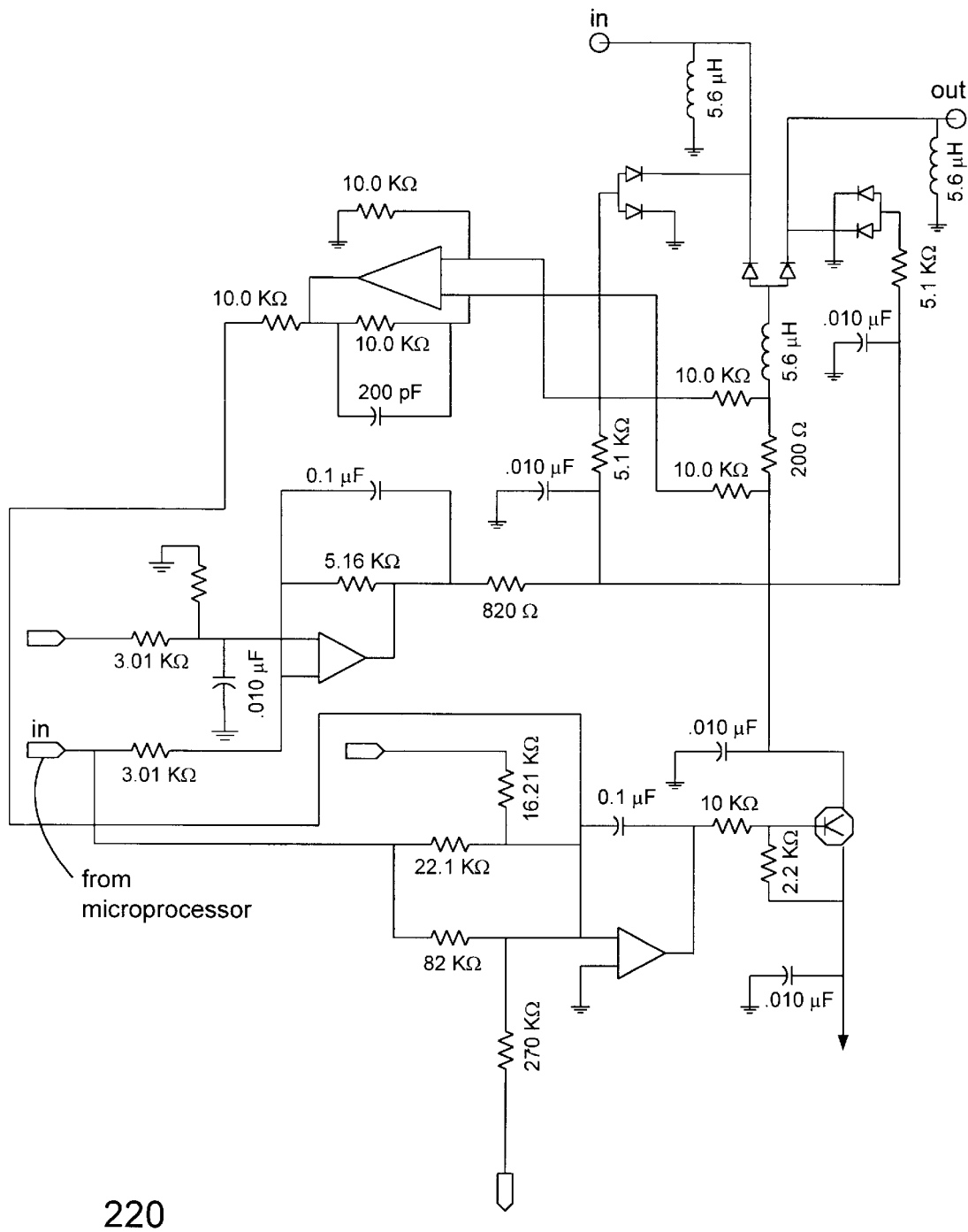
FIG. 3 is a circuit diagram of a voltage controlled attenuator that can be included in the optical transmitter of FIG. 2 in accordance with the present invention.
Figure 4:
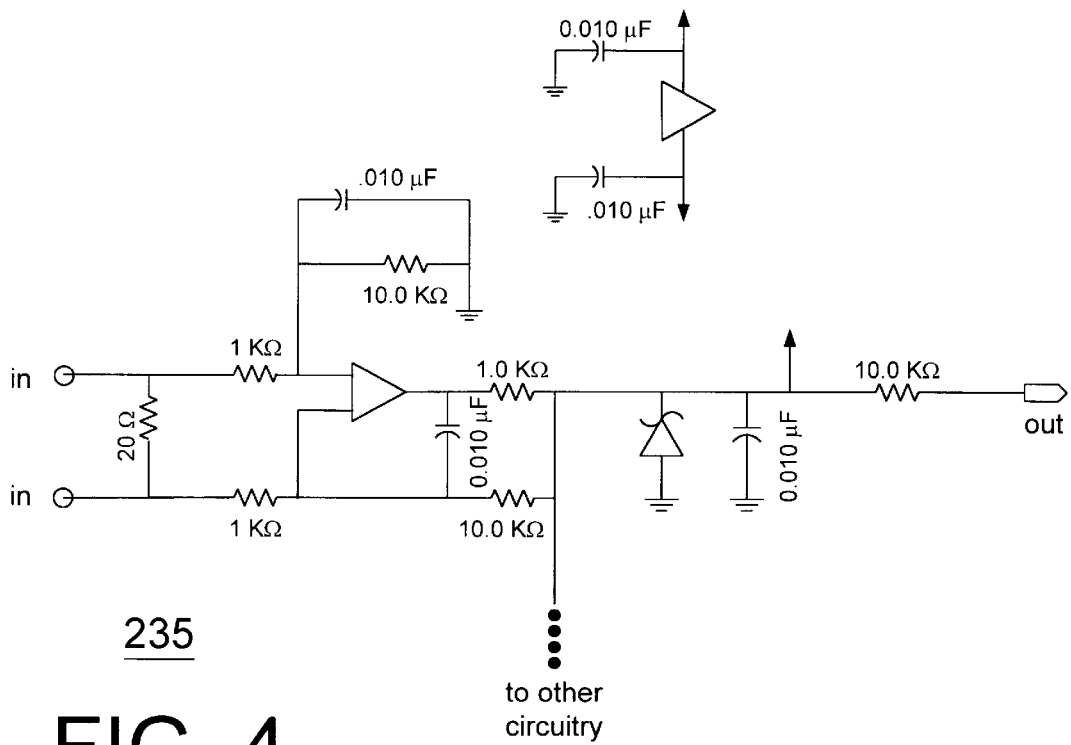
FIG. 4 is a circuit diagram of a differential amplifier that can be included in the optical transmitter of FIG. 2 in accordance with the present invention.
Figure 5:
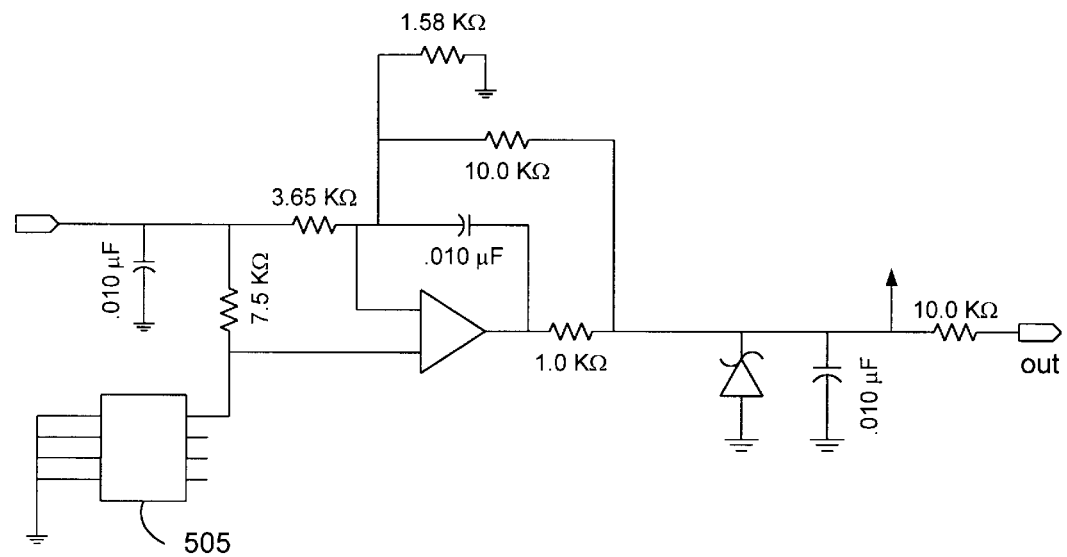
FIG. 5 is a circuit diagram of a thermistor circuit that can be included in the optical transmitter of FIG. 2 in accordance with the present invention.

Referring next to FIGS. 3–5, circuit diagrams of circuits that can be used to implement the voltage controlled attenuator 220, the differential amplifier 235, and the thermistor 230 are respectively depicted. Inputs and outputs of each circuit are shown on the respective figures. It should be noted that, in FIG. 5, a thermistor circuit is provided in which the thermistor function is provided by a conventional integrated circuit 505 and in which an actual temperature value is provided to the microprocessor 225. One of ordinary skill in the art will recognize that numerous other circuit topologies and elements can alternatively be provided to perform equivalent functions.

In summary, the optical transmitter described above provides optical and RF signals having power levels that remain constant over temperature, resulting in more reliable signal reception and decoding than in prior art transmitters. The optical transmitter of the present invention is therefore particularly useful for uncooled laser devices.

What is claimed is:

1. An optical transmitter, comprising:
    a laser diode for emitting an optical signal in accordance with an electrical information signal, wherein the laser diode is uncooled; and
    a thermal compensation circuit coupled to the laser diode for adjusting levels of the electrical information signal, in response to variations in temperature of the laser diode, to maintain a substantially constant modulation index of the laser diode, the thermal compensation circuit comprising:
        means for measuring the temperature of the laser diode and a bias current supplied to bias the laser diode;
        means for selectively attenuating the electrical information signal, in response to detecting a change in at least one of the temperature of the laser diode and the bias current supplied to the laser diode, to minimize changes in an output level of the laser diode.

2. The optical transmitter of claim 1, further comprising:
    an input for receiving the electrical information signal; and
    an output for providing the optical signal.

3. The optical transmitter of claim 2, wherein the thermal compensation circuit comprises:
    a thermistor located proximate the laser diode and having a resistance that varies with temperature;
    a voltage controlled attenuator coupled between the input and the laser diode for selectively attenuating the electrical information signal; and
    a controller coupled to the thermistor and the voltage controlled attenuator for controlling the attenuation provided by the voltage controlled attenuator in response to changes in the resistance of the thermistor.

4. The optical transmitter of claim 3, further comprising:
    a differential amplifier for measuring the bias current supplied to bias the laser diode, the differential amplifier having an output coupled to the controller.

5. The optical transmitter of claim 4, wherein the controller further controls the attenuation in response to variations in the bias current.

6. The optical transmitter of claim 3, further comprising:
    an amplifier coupled between the input of the optical transmitter and the voltage controlled attenuator for amplifying the electrical information signal.

7. The optical transmitter of claim 3, wherein the controller comprises a microprocessor.

8. An optical transmitter for providing thermal compensation without use of a thermoelectric cooler, the optical transmitter comprising:
    a laser diode for emitting an optical signal in accordance with an electrical information signal, wherein the laser diode is uncooled;
    a thermistor located proximate the laser diode, the thermistor characterized by a resistance that changes with temperature;
    measurement means for measuring a bias current supplied to bias the laser diode; and
    an attenuator coupled to the electrical information signal and the thermistor and the measurement means for selectively attenuating the electrical information signal that is received by the laser diode in response to at least one of variations in the resistance of the thermistor and variations in the bias current, wherein the thermistor, the measurement means, and the attenuator comprise a thermal compensation circuit that maintains a substantially constant modulation index of the laser diode and that minimizes changes in an output level of the laser diode.

9. The optical transmitter of claim 8, further comprising:

a controller coupled to the thermistor and the attenuator for controlling the attenuator to selectively attenuate the electrical information signal.

10. The optical transmitter of claim 9, further comprising:

an input for receiving the electrical information signal, wherein the attenuator is coupled between the input and the laser diode; and an output for providing the optical signal.

11. The optical transmitter of claim 10, wherein the controller comprises a microprocessor.

12. The optical transmitter of claim 10, wherein the attenuator is a voltage controlled attenuator.

13. The optical transmitter of claim 10, further comprising:

a differential amplifier for measuring the bias current that biases the laser diode, wherein an output of the differential amplifier is coupled to the controller.

14. A communication system for providing electrical and optical signals, the communication system comprising:

electrical communication media for transmitting an electrical information signal; and an optical node for receiving the electrical information signal and converting the electrical information signal to an optical signal for further transmission within the communication system, the optical node comprising:

a laser diode for emitting the optical signal in accordance with the electrical information signal, wherein the laser diode is uncooled; and a thermal compensation circuit coupled to the laser diode for adjusting levels of the electrical information signal in response to variations in temperature of the laser diode and for further adjusting, in response to variations in temperature of the laser diode, levels of a bias current supplied to bias the laser diode, wherein the thermal compensation circuit maintains a substantially constant modulation index of the laser diode and minimizes changes in an output level of the laser diode; and optical communication media for transmitting the optical signal.

15. The communication system of claim 14, further comprising:

signal generating equipment coupled to the electrical communication media for generating the electrical information signal; and signal processing equipment coupled to the optical communication media for processing the optical signal to recover information therefrom.

16. The communication system of claim 14, wherein the optical transmitter further comprises:

an input coupled to the electrical communication media for receiving the electrical information signal; and an output coupled to the optical communication media for providing the optical signal.

17. The communication system of claim 16, wherein the thermal compensation circuit of the optical transmitter comprises:

a thermistor located proximate the laser diode and having a resistance that varies with temperature;

a voltage controlled attenuator coupled between the input of the optical transmitter and the laser diode for selectively attenuating the electrical information signal; and a controller coupled to the thermistor and the voltage controlled attenuator for controlling the attenuation provided by the voltage controlled attenuator in response to changes in the resistance of the thermistor.

18. The communication system of claim 17, wherein:

the communication system comprises a cable television system including subscriber equipment for generating the electrical information signal and a headend for processing the optical signal.

\* \* \* \* \*